(12) United States Patent
Ishihara

(10) Patent No.: US 9,515,670 B2
(45) Date of Patent: Dec. 6, 2016

(54) ATOMIC CELL, ATOMIC CELL MANUFACTURING METHOD, QUANTUM INTERFERENCE DEVICE, ATOMIC OSCILLATOR, ELECTRONIC DEVICE, AND MOVING OBJECT

(71) Applicant: Seiko Epson Corporation, Tokyo (JP)

(72) Inventor: Naoki Ishihara, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/877,240

(22) Filed: Oct. 7, 2015

(65) Prior Publication Data

US 2016/0105149 A1    Apr. 14, 2016

(30) Foreign Application Priority Data

Oct. 14, 2014   (JP) .................................. 2014-209740

(51) Int. Cl.
*H03L 7/26*       (2006.01)
*G04F 5/14*       (2006.01)

(52) U.S. Cl.
CPC .............. *H03L 7/26* (2013.01); *G04F 5/145* (2013.01)

(58) Field of Classification Search
CPC .................................. G21K 5/08; H03B 17/00

USPC ...................................................... 331/3, 94.1
See application file for complete search history.

(56) References Cited

U.S. PATENT DOCUMENTS

| | | | | |
|---|---|---|---|---|
| 2012/0206135 A1* | 8/2012 | Nagasaka | ............. | G01R 33/26 324/244.1 |
| 2012/0313717 A1 | 12/2012 | Ridley et al. | | |
| 2013/0061655 A1* | 3/2013 | Schober | .................... | G04F 5/14 73/23.2 |
| 2015/0027908 A1* | 1/2015 | Parsa | ........................ | F17C 3/00 206/7 |

FOREIGN PATENT DOCUMENTS

| | | |
|---|---|---|
| JP | 2009-283526 A | 12/2009 |
| JP | 2010-205875 A | 9/2010 |
| JP | 2013-003139 A | 1/2013 |

* cited by examiner

*Primary Examiner* — Jeffrey Shin
(74) *Attorney, Agent, or Firm* — Harness, Dickey & Pierce, P.L.C.

(57) ABSTRACT

An atomic cell includes: alkaline metallic atoms, a body portion and window portions forming an inner space in which alkaline metallic atoms are sealed, and a getter material disposed in the inner space. The getter material is an alloy including at least one of titanium, barium, tantalum, zirconium, aluminum, vanadium, indium, and calcium, or an Al—Zr—V—Fe based alloy.

19 Claims, 12 Drawing Sheets

ATOMIC CELL, ATOMIC CELL MANUFACTURING METHOD, QUANTUM INTERFERENCE DEVICE, ATOMIC OSCILLATOR, ELECTRONIC DEVICE, AND MOVING OBJECT

CROSS REFERENCE

This application claims benefit of Japanese Application No. 2014-209740, filed on Oct. 14, 2014. The disclosure of the prior application is hereby incorporated by reference herein in its entirety.

BACKGROUND

1. Technical Field

The present invention relates to an atomic cell, an atomic cell manufacturing method, a quantum interference device, an atomic oscillator, an electronic device, and a moving object.

2. Related Art

As an oscillator having a highly accurate oscillation characteristic over a long term, an atomic oscillator that oscillates based on energy transfer of atoms of an alkaline metal such as rubidium or cesium is known.

Generally, an operation principle of the atomic oscillator is divided into a method using a double resonance phenomenon using light and microwaves, and a method using coherent population trapping (CPT) using two types of lights having different wavelengths. Any type of atomic oscillator includes an atomic cell (a gas cell) in which an alkaline metal is sealed (for example, see JP-A-2009-283526). In addition, other than the alkaline metal, sealing an inert gas such as nitrogen, argon, or neon in the atomic cell as a buffer gas has also been generally performed.

However, in the atomic oscillator in the related art, there is a problem in that an unnecessary matter is mixed into in the atomic cell other than the alkaline metal or the buffer gas in the manufacturing process or the like, and frequency stability is deteriorated due to the unnecessary matter. For example, in the atomic oscillator using the coherent population trapping, the alkaline metal in the atomic cell is irradiated with two resonance beams, and when a different frequency between the two resonance beams is a specific value, an EIT signal, which is a rapid signal generated in accordance with an electromagnetically induced transparency (EIT) phenomenon in which both of the resonance beams pass through the alkaline metal in the atomic cell without being absorbed therein, is used as a reference. However, in the related art, the behavior of the alkaline metallic atom is changed due to the unnecessary matter in the atomic cell, and the change adversely affects the EIT signal. As a result, there is a problem in that the frequency stability is deteriorated.

SUMMARY

An advantage of some aspects of the invention is to provide an atomic cell which is capable of improving the frequency stability and a manufacturing method of the atomic cell, and a quantum interference device, an atom oscillator, an electronic device, and a moving object which include the atomic cell.

The invention can be implemented as the following forms or application examples.

Application Example 1

An atomic cell according to this application example includes: metallic atoms; a wall portion forming an inner space in which the metallic atoms are sealed; and a getter material that is disposed in the inner space.

According to the atomic cell, the getter material is disposed in the inner space, and thus it is possible to adsorb or absorb at least some of the gaseous unnecessary matters included in the inner space to the getter material. Therefore, it is possible to reduce an amount of the unnecessary matters floating in the atomic cell, and as a result, it is possible to prevent the deterioration of frequency stability, which is because that the behavior of the metallic atom is changed due to the unnecessary matter in the atomic cell, and the change adversely affects the EIT signal. Accordingly, it is possible to improve the frequency stability.

Application Example 2

In the atomic cell according to the application example, it is preferable that the wall portion includes a first substrate having a concave portion which is opened to one surface side thereof, and a second substrate that is bonded to the one surface side of the first substrate, and forms an inner space together with the first substrate.

With this configuration, it is possible to realize the miniaturization of the atomic cell. In addition, it is likely that the unnecessary matter in the atomic cell adversely affects the EIT signal when the miniaturization of the atomic cell is realized, and thus the invention is applicable to the atomic cell having this structure, thereby obtaining a remarkable effect.

Application Example 3

In the atomic cell according to the application example, it is preferable that a coating film is provided on a surface of the wall portion facing a surface of the inner space.

With this configuration, the behavior of gaseous metallic atoms in the atomic cell is stabilized, and thus, the frequency stability can be improved.

Application Example 4

In the atomic cell according to the application example, it is preferable that the getter material is held in the coating film.

With this configuration, the movement of the getter material is prevented or reduced, and thus it is possible to prevent or reduce the influence of the getter material on the EIT signal.

Application Example 5

An atomic cell manufacturing method according to this application example includes: preparing a first substrate that includes a concave portion opening to one surface side, a second substrate, a solid metal compound including metal, and a getter material; disposing the metal compound in the concave portion; sealing the concave portion by bonding the second substrate to the one surface side of the first substrate; and subjecting the metal compound to a decomposition reaction so as to extract the metal.

According to the atomic cell manufacturing method, in the atomic cell to be obtained, the getter material is disposed in the inner space, and thus it is possible to adsorb or absorb at least some of the gaseous unnecessary matters included in the inner space to the getter material. Therefore, in the atomic cell to be obtained, it is possible to reduce an amount of the unnecessary matters floating in the atomic cell, and as a result, it is possible to prevent the deterioration of frequency stability, which is because that the behavior of the metallic atom is changed due to the unnecessary matter in the atomic cell, and the change adversely affects the EIT signal. Accordingly, in the atomic cell to be obtained, it is possible to improve the frequency stability.

In addition, metallic atoms are sealed in the inner space by using a solid metal compound, and thus in the sealing of the concave portion, it is possible to prevent metallic atoms from attaching on the bonded surface of the first substrate and the second substrate. Therefore, it is possible to simply and firmly bond the first substrate and the second substrate. As a result, it is possible to improve reliability of the atomic cell.

Application Example 6

In the atomic cell manufacturing method according to the application example, it is preferable that the metal compound is cesium chloride, and in the disposing of the metal compound, calcium is disposed in the concave portion.

It is possible to generate cesium by reducing cesium chloride with calcium as a reducing agent. For this reason, it is possible to seal the cesium atom in the atomic cell.

Application Example 7

In the atomic cell manufacturing method according to the application example, it is preferable that the metal compound is cesium azide.

It is possible to generate cesium by reducing cesium azide. For this reason, it is possible to seal the cesium atom in the atomic cell.

Application Example 8

In the atomic cell manufacturing method according to the application example, in the subjecting of the metal compound to a decomposition reaction, it is preferable that the metal compound is irradiated with the energy line so as to cause the decomposition reaction.

With this configuration, it is possible to cause the decomposition reaction on the metal compound which is disposed in the sealed inner space.

Application Example 9

In the atomic cell manufacturing method according to the application example, it is preferable that the getter material is an alloy including at least one of titanium, barium, tantalum, zirconium, aluminum, vanadium, indium, and calcium, or an Al—Zr—V—Fe based alloy.

With this configuration, it is possible to adsorb or absorb the unnecessary matter in the atomic cell to the getter material.

Application Example 10

In the atomic cell manufacturing method according to the application example, it is preferable that the first substrate includes silicon, and the second substrate includes glass.

With this configuration, it is possible to manufacture the compact atomic cell with high accuracy by using an etching technique and a photolithography technique.

Application Example 11

In the atomic cell manufacturing method according to the application example, in the sealing of the concave portion, it is preferable that the first substrate and the second substrate are bonded to each other by heat bonding.

In the heat bonding, the first substrate and the second substrate have a high temperature, but the alkaline metal has relatively low melting point and boiling point, for example. Therefore, at the time of heat bonding, when an alkali metal simple substance exists, the alkaline metal is attached on the bonded surface of the first substrate and the second substrate, thereby causing the deterioration of the bonding strength. Accordingly, when the sealing is performed by the aforementioned bonding, the invention is applicable, thereby obtaining a remarkable effect.

Application Example 12

In the atomic cell manufacturing method according to the application example, in the sealing of the concave portion, it is preferable that the first substrate and the second substrate are bonded to each other by anodic bonding.

In the anodic bonding, the first substrate and the second substrate have a high temperature, but the alkali metal simple substance has relatively low melting point and boiling point, for example. Therefore, at the time of heat bonding, when the alkali metal simple substance exists, the alkaline metal is attached on the bonded surface of the first substrate and the second substrate, thereby causing the deterioration of the bonding strength. Accordingly, when the sealing is performed by the aforementioned bonding, the invention is applicable, thereby obtaining a remarkable effect.

Application Example 13

In the atomic cell manufacturing method according to the application example, in the preparing, it is preferable that the first substrate includes the plurality of concave portions.

With this configuration, it is possible to efficiently manufacture the atomic cell.

Application Example 14

In the atomic cell manufacturing method according to the application example, after the sealing of the concave portion, it is preferable that a bonded body obtained by bonding the first substrate and the second substrate is individualized for each concave portion.

With this configuration, it is possible to efficiently manufacture the atomic cell.

Application Example 15

A quantum interference device according to this application example includes the atomic cell according to the application example.

With this configuration, it is possible to provide the quantum interference device having the excellent frequency stability.

Application Example 16

An atomic oscillator according to this application example includes the atomic cell according to the application example.

With this configuration, it is possible to provide the atomic oscillator having the excellent frequency stability.

Application Example 17

An electronic device according to this application example includes the atomic cell according to the application example.

With this configuration, it is possible to provide the electronic device including the atomic cell which is capable of improving the frequency stability.

Application Example 18

A moving object according to this application example includes the atomic cell according to the application example.

With this configuration, it is possible to provide the moving object including the atomic cell which is capable of improving the frequency stability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an atomic cell, an atomic cell manufacturing method, a quantum interference device, anatomic oscillator, an electronic device, and a moving object according to embodiments of the invention will be described based on embodiments shown in the accompanying drawings.

1. Atomic Oscillator (Quantum Interference Device)

First, an atomic oscillator according to an embodiment of the invention (the atomic oscillator including quantum interference device according to an embodiment of the invention) will be described. Hereinafter, an example in which the quantum interference device of the present embodiment is applied to an atomic oscillator is described, but the quantum interference device of the present embodiment is not limited thereto, and for example, may be applied to a magnetic sensor, a quantum memory, or the like, in addition to the atomic oscillator.

First Embodiment

Figure 1:
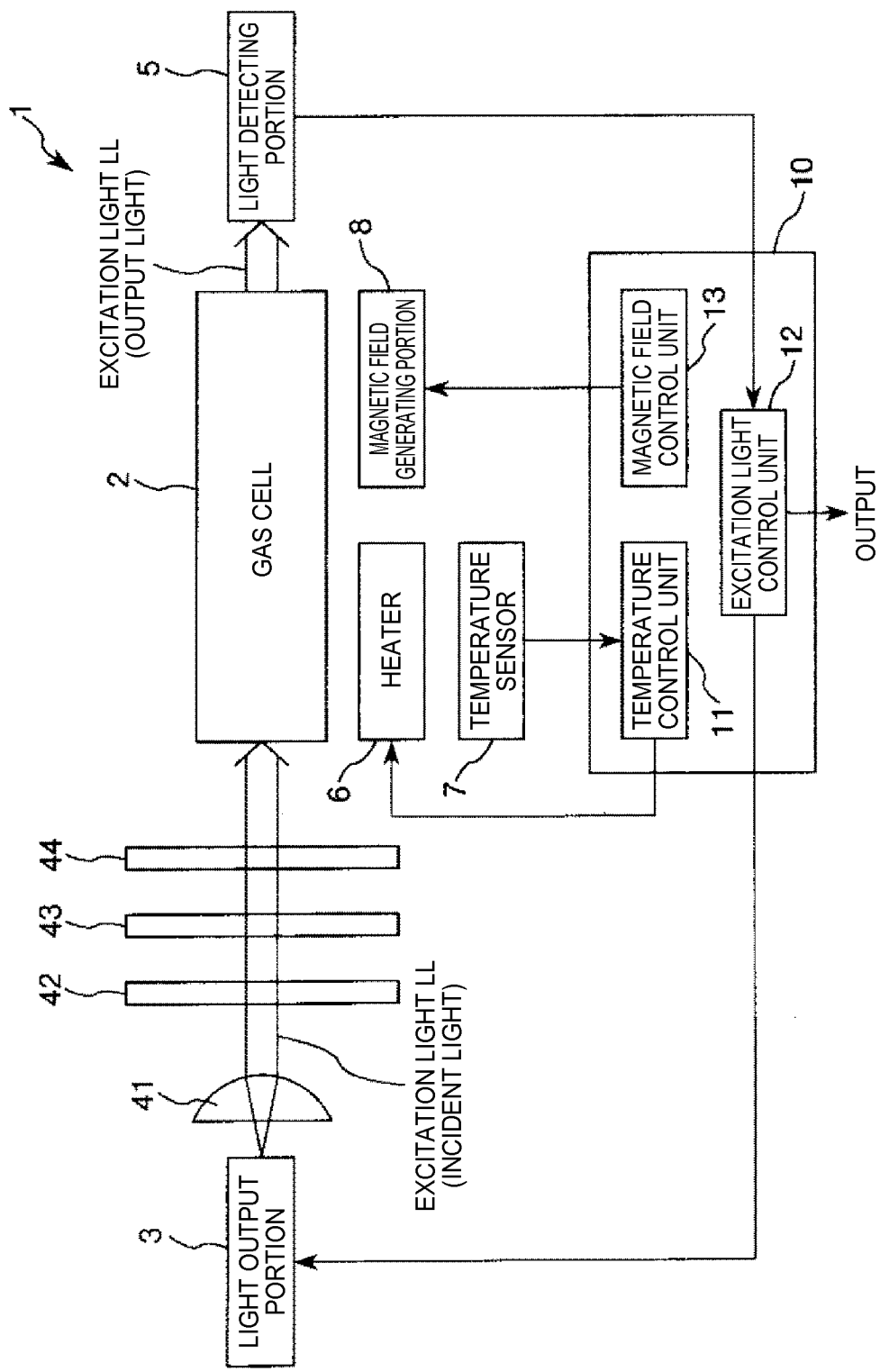
FIG. 1 is a schematic diagram illustrating an atomic oscillator (a quantum interference device) according to a first embodiment of the invention.
Figure 2:
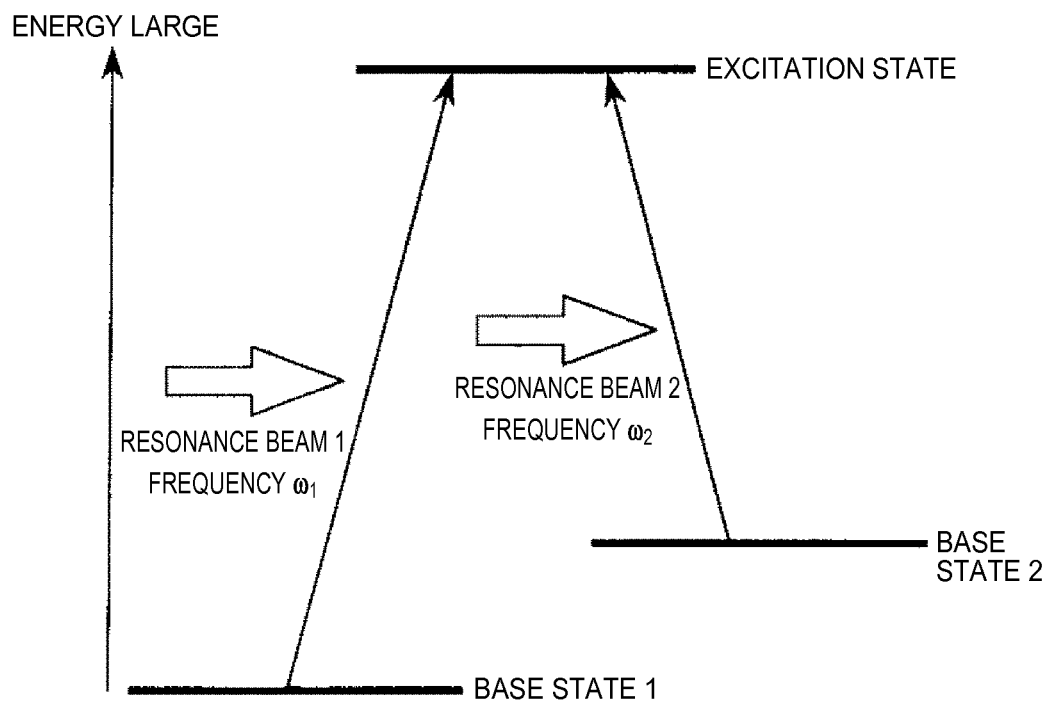
FIG. 2 is a diagram illustrating an energy state of an alkaline metal.
Figure 3:
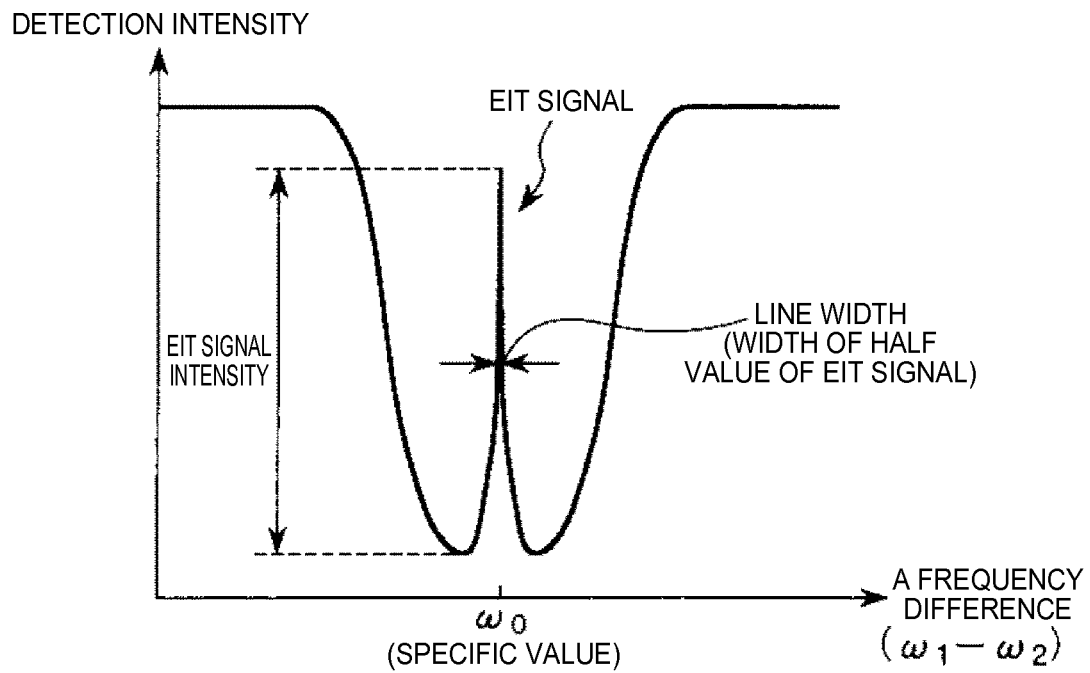
FIG. 3 is a graph illustrating a relationship of a frequency difference between two beams which are output from a light output portion and intensity of light which is detected by a light detecting portion.

FIG. 1 is a schematic diagram illustrating an atomic oscillator (quantum interference device) according to a first embodiment of the invention. FIG. 2 is a diagram illustrating an energy state of an alkaline metal, and FIG. 3 is a graph illustrating a relationship of a frequency difference between two beams which are output from a light output portion and intensity of light which is detected by a light detecting portion.

An atomic oscillator 1 shown in FIG. 1 is an atomic oscillator using coherent population trapping. As shown in FIG. 1, the atomic oscillator 1 includes an atomic cell 2 (gas cell), a light output portion 3, optical components 41, 42, 43, and 44, a light detecting portion 5, a heater 6, a temperature sensor 7, a magnetic field generating portion 8, and a control portion 10.

First, the principle of the atomic oscillator 1 will be briefly described.

As illustrated in FIG. 1, in the atomic oscillator 1, the light output portion 3 emits excitation light LL to the atomic cell 2, and the excitation light LL which passes through the atomic cell 2 is detected by the light detecting portion 5.

The gaseous alkaline metal (metallic atoms) is sealed in the atomic cell 2, and as illustrated in FIG. 2, the alkaline metal has energy levels of a 3-level system, and may show three states of two base states (base states 1 and 2) and an excitation state having different energy levels. Here, the base state 1 represents an energy state lower than the base state 2.

The excitation light LL output from the light output portion 3 has two resonance beams 1 and 2 having different frequencies, and when the aforementioned gaseous alkaline metal is irradiated with these two types of resonance beams 1 and 2, light absorptance (light transmittance) of the resonance beams 1 and 2 in the alkaline metal is changed according to a difference ($\omega_1-\omega_2$) between a frequency $\omega_1$ of the resonance beam 1 and a frequency $\omega_2$ of the resonance beam 2.

Further, when the difference ($\omega_1-\omega_2$) between the frequency $\omega_1$ of the resonance beam 1 and the frequency $\omega_2$ of the resonance beam 2 matches a frequency corresponding to an energy difference between the base state 1 and the base state 2, excitations from the base states 1 and 2 to the excitation state are respectively stopped. Here, both of the resonance beams 1 and 2 pass through the alkaline metal without being absorbed therein. Such a phenomenon is referred to as a CPT phenomenon or an electromagnetically induced transparency (EIT) phenomenon.

For example, if the light output portion 3 fixes the frequency $\omega_1$ of the resonance beam 1 and changes the frequency $\omega_2$ of the resonance beam 2, when the difference ($\omega_1-\omega_2$) between the frequency $\omega 1$ of the resonance beam 1 and the frequency $\omega 2$ of the resonance beam 2 matches a frequency $\omega_0$ corresponding to an energy difference between the base state 1 and the base state 2, a detection intensity of the light detecting portion 5 rapidly increases as shown in FIG. 3. Such a rapid signal is detected as an EIT signal. The EIT signal has a specific value determined by the type of the alkaline metal. Accordingly, it is possible to configure an oscillator by using such an EIT signal.

Hereinafter, each portion of the atomic oscillator 1 will be briefly described.

Atomic Cell

The alkaline metal such as the gaseous rubidium, cesium, or sodium is sealed in the atomic cell 2. Further, a noble gas such as argon or neon, or an inert gas such as nitrogen may be sealed in the atomic cell 2 as a buffer gas together with the alkaline gas, as necessary.

In addition to the above substances, an alkali metallic compound, a getter material, and the like other than are also disposed in the atomic cell 2. Note that, these will be described in detail when describing a configuration of the atomic cell 2.

Light Output Portion

The light output portion 3 (a light source) has a function of emitting excitation light LL for exciting the alkaline metallic atom in the atomic cell 2.

More specifically, the light output portion 3 outputs, as the excitation light LL, two beams (a resonance beam 1 and a resonance beam 2) having different frequencies as described above. The resonance beam 1 may excite (resonate) the alkaline metal in the atomic cell 2 from the above-described base state 1 to the excitation state. On the other hand, the resonance beam 2 may excite (resonate) the alkaline metal in the atomic cell 2 from the above-described base state 2 to the excitation state.

The light output portion 3 is not particularly limited as long as it can output excitation light as described above, but for example, a semiconductor laser such as a vertical cavity surface emitting laser (VCSEL), or the like may be used.

Although not shown, the light output portion 3 is adjusted into a predetermined temperature by a temperature adjustment element (heat resistor, Peltier element, or the like).

Optical Component

The plural optical components 41, 42, 43, and 44 are provided on a light path of the excitation light LL between the above-mentioned light output portion 3 and the atomic cell 2, respectively. Here, the optical component 41, the optical component 42, the optical component 43, and the optical component 44 are sequentially disposed from the side of the light output portion 3 to the side of the atomic cell 2.

The optical component 41 is a lens. Thus, the excitation light LL may be applied to the atomic cell 2 without any waste.

Further, the optical component 41 has a function of converting the excitation light LL into parallel light. Thus, it is possible to simply and reliably prevent the excitation light LL from being reflected from an inner wall of the atomic cell 2. Thus, it is possible to preferably generate resonance of the excitation light in the atomic cell 2. As a result, it is possible to improve oscillation characteristics of the atomic oscillator 1.

The optical component 42 is a polarizing plate. Thus, it is possible to adjust polarization of the excitation light LL from the light output portion 3 in a predetermined direction.

The optical component 43 is a photosensitive filter (ND filter). Thus, it is possible to adjust (reduce) the intensity of the excitation light LL incident into the atomic cell 2. Accordingly, even when the output of the light output portion 3 is high, it is possible to adjust the excitation light incident into the atomic cell 2 to a desired intensity of light. In the present embodiment, the intensity of the excitation light LL having polarization in a predetermined direction, passed through the above-described optical component 42, is adjusted by the optical component 43.

The optical component 44 is a $\lambda/4$ wavelength plate. Thus, the optical component 44 may convert the excitation light LL from the light output portion 3, from linearly polarized light into circularly polarized light (right-handed circularly polarized light or left-handed circularly polarized light).

As will be described later, in a state where alkaline metallic atoms in the atomic cell 2 are subject to Zeeman splitting by a magnetic field of the magnetic field generating portion 8, if excitation light which is linearly polarized light is applied to the alkaline atoms, the alkaline metallic atoms are equivalently dispersed at plural levels obtained by the Zeeman splitting through interaction between the excitation light and the alkaline metallic atoms. As a result, the number of alkaline metallic atoms at a desired energy level is relatively reduced compared with the number of alkaline metallic atoms at other energy levels. Thus, the number of atoms for exhibiting a desired EIT phenomenon is reduced, and the intensity of a desired EIT signal is reduced. As a result, the oscillation characteristics of the atomic oscillator 1 deteriorate.

On the other hand, in a state where alkaline metallic atoms in the atomic cell 2 are subject to Zeeman splitting by a magnetic field of the magnetic field generating portion 8 as described below, if excitation light which is circularly polarized light is applied to the alkaline metallic atoms, it is possible to relatively increase the number of alkaline metallic atoms at a desired energy level among plural levels obtained by the Zeeman splitting compared with the number of alkaline metallic atoms at other energy levels through interaction between the excitation light and the alkaline metallic atoms. Thus, the number of atoms for exhibiting a desired EIT phenomenon is increased, and the intensity of a desired EIT signal is increased. As a result, it is possible to enhance the oscillation characteristics of the atomic oscillator 1.

Light Detecting Portion

The light detecting portion 5 has a function of detecting the intensity of the excitation light LL (the resonance beams 1 and 2) having passed through the inside of the atomic cell 2.

The light detecting portion 5 is not particularly limited as long as it can detect excitation light, as described above, but for example, a light detector (light receiving element) such as a solar cell or a photodiode may be used.

Heater

The heater 6 (heating portion) has a function of heating the above-mentioned atomic cell 2 (more specifically, the alkaline metal in the atomic cell 2). Thus, it is possible to maintain the alkaline metal in the atomic cell 2 in a gas form of an appropriate concentration.

The heater 6 is configured to include a heat resistor which is heated by, for example, electrification. The heat resistor may be provided by coming in contact with the atomic cell 2, or may be provided with respect to the atomic cell 2 in non-contact state.

For example, when the heat resistor is provided by coming in contact with the atomic cell 2, the heat resistor is provided in each of the window portions of the atomic cell 2. With this, it is possible to prevent alkaline metallic atoms from being condensed in the window portions of the atomic cell 2. As a result, it is possible to enhance the characteristics (oscillation characteristic) of the atomic oscillator 1 over a long period of time. The heat resistor may be formed of a material having a light transmitting property with respect to the excitation light. Specifically, for example, a transparent electrode material such as an oxide such as indium tin oxide (ITO), indium zinc oxide (IZO), $In_3O_3$, $SnO_2$, Sb-containing $SnO_2$, or Al-containing ZnO may be used. The heat resistor may be formed using a chemical vapor deposition method such as a plasma CVD and a thermal CVD, a dry plating method such as vacuum deposition, a sol-gel method and the like.

In addition, when the heat resistor is provided with respect to the atomic cell 2 in non-contact state, the heat resistor may transfer heat to the atomic cell 2 via a material such as metal which is excellent in thermal conductivity or ceramics.

The heater 6 is not limited to the above-described configuration, and various heaters that can heat the atomic cell 2 may be used. In addition, the atomic cell 2 may be heated using a Peltier element together with the heater 6, or instead of the heater 6.

Temperature Sensor

The temperature sensor 7 detects the temperature of the heater 6 or the atomic cell 2. Further, a heating value of the heater 6 is controlled based on the detection result of the temperature sensor 7. Thus, it is possible to maintain alkaline metallic atoms in the atomic cell 2 at a desired temperature.

An installation position of the temperature sensor 7 is not particularly limited. For example, the temperature sensor 7 may be provided on the heater 6 or on an external surface of the atomic cell 2.

The temperature sensor 7 is not particularly limited, and known various temperature sensors such as a thermistor and a thermocouple may be used.

Magnetic Field Generating Portion

The magnetic field generating portion 8 has a function of generating a magnetic field for Zeeman-splitting retracted plural energy levels of the alkaline metal in the atomic cell 2. Thus, it is possible to enlarge a gap between different retracted energy levels of the alkaline metal by the Zeeman splitting, to thereby enhance a resolving power. As a result, it is possible to enhance the accuracy of an oscillation frequency of the atomic oscillator 1.

The magnetic field generating portion 8 is configured by Helmholtz coils disposed so that the atomic cell 2 is interposed therebetween, or a solenoid coil disposed to cover the atomic cell 2, for example. Thus, it is possible to generate a uniform magnetic field in one direction in the atomic cell 2.

Further, the magnetic field generated by the magnetic field generating portion 8 is a constant magnetic field (a direct current magnetic field), but an alternating magnetic field may be overlapped therewith.

Control Unit

The control portion 10 has a function of controlling the light output portion 3, the heater 6, and the magnetic field generating portion 8, respectively.

The control portion 10 includes an excitation light control portion 12 that controls frequencies of the resonance beams 1 and 2 of the light output portion 3, a temperature control portion 11 that controls the temperature of the alkaline metal in the atomic cell 2, and a magnetic field control portion 13 that controls a magnetic field from the magnetic field generating portion 8.

The excitation light control portion 12 controls frequencies of the resonance beams 1 and 2 output from the light output portion 3 based on the detection result of the above-described light output portion 5. More specifically, the excitation light control portion 12 controls the frequencies of the resonance beams 1 and 2 output from the light output portion 3 so that the frequency difference $(\omega_1-\omega_2)$ becomes the above-mentioned frequency $\omega_0$ specific to the above-described alkaline metal.

Here, the excitation light control portion 12 includes a voltage control type quartz oscillator (oscillation circuit) (not shown), and outputs an output signal of the voltage control type quartz oscillator as an output signal of the atomic oscillator 1 while performing synchronizing and adjusting an oscillation frequency of the voltage control type quartz oscillator based on the detection result of the light detecting portion 5.

For example, the excitation light control unit 12 includes a multiplier (not shown) for performing frequency multiplication on the output signal from the voltage control type quartz oscillator, and a signal (a high frequency signal) which is multiplied by this multiplier is superimposed on a DC bias so as to be input to the light output portion 3 as a driving signal. Due to this, when the voltage control type quartz oscillator is controlled so as to detect the EIT signal in the light detecting portion 5, a desired frequency signal is output from the voltage control type quartz oscillator. When a multiplication rate of this multiplier is set, for example, to be a desired frequency f of the output signal from the atomic oscillator 1, $\omega_0/(2\times f)$ is established. Therefore, when the oscillation frequency of the voltage control type quartz oscillator is set to be f, it is possible to output two light beams in which the frequency difference $(\omega_1-\omega_2)$ becomes $\omega_0$ by modulating a light emitting element such as a semiconductor laser included in the light output portion 3 using the signal from the multiplier.

Further, the temperature control portion 11 controls electrification to the heater 6 based on the detection result of the temperature sensor 7. Thus, it is possible to maintain the atomic cell 2 in a desired temperature range. For example, a temperature of the atomic cell 2 is adjusted to be about 70° C. by the heater 6.

In addition, the magnetic field control portion 13 controls electrification to the magnetic field generating portion 8 so that a magnetic field generated by the magnetic field generating portion 8 becomes uniform.

The control portion 10 having such a configuration is provided in an IC chip mounted on a board, for example.

Hereinbefore, the configuration of the atomic oscillator 1 has been briefly described.

Detailed Description of Atomic Cell

Figure 4A:
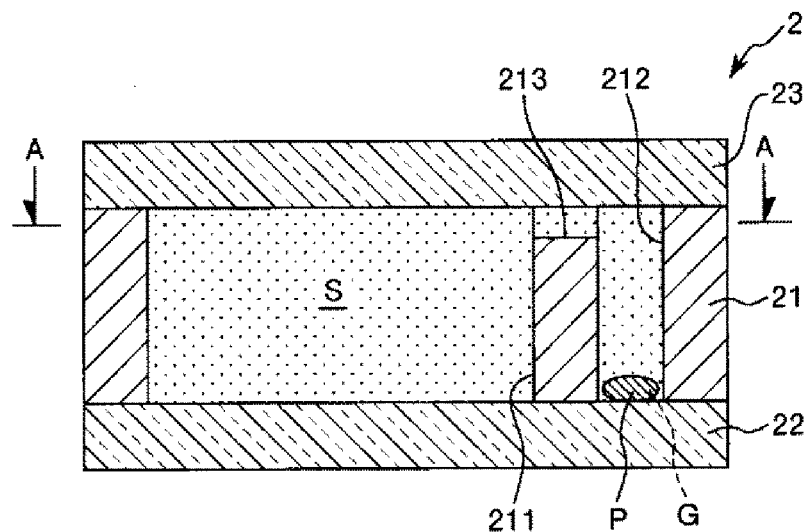
FIG. 4A is a longitudinal view of an atomic cell which is included in the atomic oscillator as illustrated in FIG. 1.
Figure 4B:
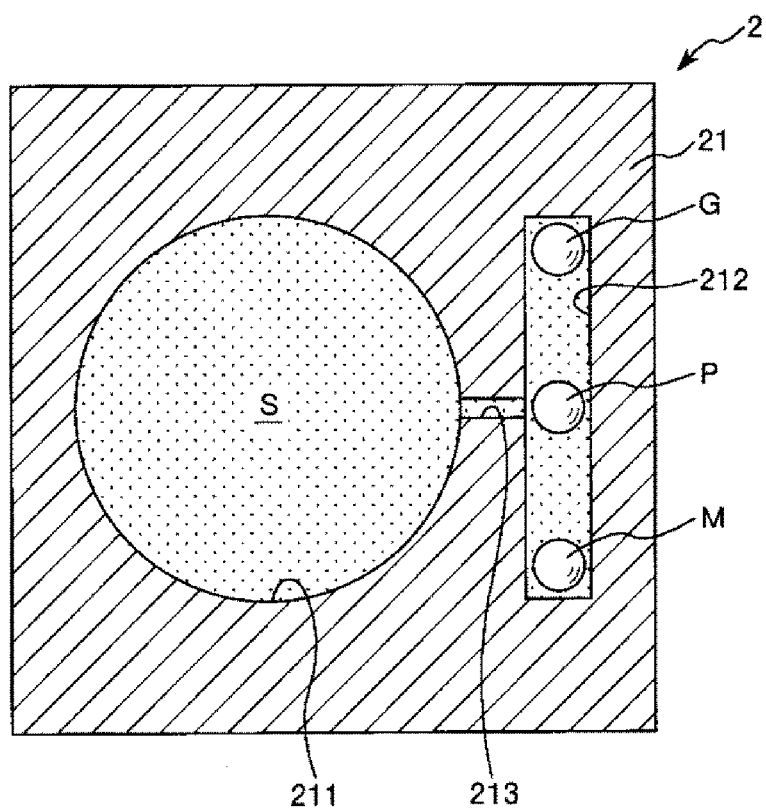
FIG. 4B is a sectional view (cross-sectional view) taken along line A-A in FIG. 4A.

FIG. 4A is a longitudinal view of an atomic cell which is included in the atomic oscillator as illustrated in FIG. 1, and FIG. 4B is a sectional view (cross-sectional view) taken along line A-A in FIG. 4A.

Note that, hereinafter, for convenience of explanation, in FIG. 4A, the upper side is referred to "up" and the lower side is referred to as "down".

As illustrated in FIG. 4A, the atomic cell 2 includes the body portion 21, and a pair of the window portions 22 and 23 which interpose the body portion 21 therebetween. In the atomic cell 2, the body portion 21 is disposed between the pair of window portions 22 and 23, and the inner space S in which the gaseous alkaline metal is sealed is formed (configured) by being partitioned off by the body portion 21 and the pair of window portions 22 and 23.

Here, a "wall portion" which partitions off the inner space S is formed of the body portion 21 and the pair of window portions 22 and 23, and the body portion 21 and the window portion 22 forma "first substrate" including a concave portion which opens to one surface side, and the window portion 23 forms a "second substrate" which is bonded to the aforementioned one surface side of the first substrate and forms the inner space S together with the first substrate. In this way, with a stacked structure made by stacking a plurality of substrates, it is possible to realize the miniaturization of the atomic cell 2. In addition, when the miniaturization of the atomic cell 2 is realized, it is likely that the unnecessary matter in the atomic cell 2 adversely affects the EIT signal, and thus present is applicable to the atomic cell 2 having such a structure, thereby obtaining a remarkable effect. Note that, it can be said that the body portion 21 and the window portion 23 form the "first substrate" including a concave portion which opens to one surface side, and the window portion 22 forms the "second substrate" which is bonded to the aforementioned one surface side of the first substrate and forms the inner space S together with the first substrate.

The body portion 21 is formed into a plate shape of which a vertical direction corresponds to a thickness direction, and the body portion 21 is formed of through holes 211 and 212 passing through the thickness direction (the vertical direction) of the body portion 21, and groove 213 (a concave portion) which communicates the through hole 211 opening to the upper surface of the body portion 21 to the through hole 212.

A material for forming the body portion 21 is not particularly limited, and examples of the material include a glass material, crystal, a metal material, a resin material, or a silicon material. Among these, it is preferable to use any one of the glass material, the crystal, and the silicon material, and it is more preferable to use the silicon material. Therefore, even when a compact atomic cell 2 of which the width and the height is equal to or smaller than 10 mm is formed, the body portion 21 may be easily formed with high accuracy using a micro processing technique such as etching. Particularly, it is possible to perform the micro processing on the silicon by etching. Accordingly, even in a case where the miniaturization of the atomic cell 2 is realized by forming the body portion 21 with the silicon, it is possible to simply form the body portion 21 with high accuracy. In addition, when the window portions 22 and 23 are formed of the glass material, the body portion 21 may be simply and air-tightly bonded to the window portions 22 and 23 using an anodic bonding method, thereby realizing the atomic cell 2 with the excellent reliability.

The window portion 22 is bonded to the lower surface of the body portion 21, whereas the window portion 23 is bonded to the upper surface of the body portion 21. Due to this, lower end openings of the through holes 211 and 212 is blocked by the window portion 22, upper end openings of the through holes 211 and 212 and an opening of the groove 213 are blocked by the window portion 23. In addition, the inner space S which is formed of the through holes 211 and 212, and the groove 213 is formed as an airtightly sealed space.

A bonding method of the body portion 21 and the window portions 22 and 23 is determined according to materials of these components, and is not particularly limited as long as the components can be air-tightly bonded. For example, a bonding method using an adhesive, a direct bonding method, an anodic bonding method, a surface activation bonding method, or the like may be used. Among these, it is preferable to use the direct bonding method or the anodic bonding method. By using this method, the body portion 21 may be simply and air-tightly bonded to the window portions 22 and 23, thereby realizing the atomic cell 2 with the excellent reliability.

Each of the window portions 22 and 23, which is bonded to the body portion 21 has a light transmitting property with respect to the excitation light from the above-described light output portion 3. In addition, the window portion 22 on one side is an incident side window portion through which the excitation light LL is incident into the inner space S of the atomic cell 2, and the window portion 23 on the other side is an output side window portion through which the excitation light LL is output from the inner space S of the atomic cell 2.

In addition, the window portions 22 and 23 are respectively formed into the plate shape. Here, the window portions 22 and 23 respectively may form a "substrate" which is stacked on the body portion 21.

A material for forming the window portions 22 and 23 (substrate) is not particularly limited as long as a material has the aforementioned light transmitting property with respect to the excitation light, and examples of the material include a glass material, crystal, and the like, and it is preferable to use the glass material. With this material, it is possible to realize the window portions 22 and 23 having the light transmitting property with respect to excitation light. In addition, when the body portion 21 is formed of silicon, the window portions 22 and 23 are formed of glass, and thus the body portion 21 may be simply and air-tightly bonded to the window portions 22 and 23 using the anodic bonding method, thereby realizing the atomic cell 2 with the excellent reliability. In addition, according to the thickness of the window portions 22 and 23 and the intensity of the excitation light, it is possible to configure the window portions 22 and 23 with silicon. In this case, it is possible to directly bond the body portion 21 and the window portions 22 and 23.

The gaseous alkaline metal is accommodated in the inner space S which is partitioned off by the body portion 21 and the window portions 22 and 23. The gaseous the alkaline metal which is accommodated in the inner space S is excited by the excitation light LL in the through hole 211. That is, at least a portion of the space in the through hole 211 forms a "light transmitting space" through which the excitation light LL passes. In the embodiment, the cross-sectional view of the through hole 211 is formed into a circular shape, and the cross-section of light transmitting space (not shown) formed into a shape (that is, the circular shape) similar to the cross-section of the through hole 211, and is set to be slightly smaller than the cross-section of the through hole 211. Meanwhile, the cross-sectional shape of the through hole 211 is not limited to the circular shape, and may be a polygonal shape such as a quadrangle or a pentagon, an elliptical shape, or the like, for example.

In addition, the space in the through hole 212 of the inner space S communicates with the space in the through hole 211 via the space in the groove 213. In the embodiment, the cross-section of the through hole 212 is formed into a rectangular shape. Meanwhile, the cross-sectional shape of the through hole 212 is not limited to the rectangular shape, but may be a polygonal shape such as a pentagon, a circular shape, an elliptical shape, or the like, for example.

A liquid or solid alkaline metal alkaline metal M is accommodated in the space in the through hole 212. That is, the space in the through hole 212 is a space which forms a portion of the inner space S or communicates with the inner space S, and forms a "metal reserving portion" in which the liquid or solid alkaline metal M is disposed. The liquid or solid alkaline metal M and the gaseous the alkaline metal in the inner space S are in a state of equilibrium under a saturated vapor pressure. With this, it is possible to keep the gaseous the alkaline metal in the inner space S in a predetermined concentration. In addition, it is possible to reduce the influence of the alkaline metal M on the frequency properties by disposing the alkaline metal M in the space in the through hole 212 which is separated from the space in the through hole 211.

In addition, a compound P and a getter material G are disposed in the space in the through hole 212.

The compound P is a residual obtained after decomposition reaction of the metal compound P1 which is used for manufacturing the atomic cell 2, for example, an unreacted metal compound P1. In addition, the compound P may include a product other than the alkaline metal which is produced through the decomposition reaction of the metal compound P1. In addition, it is possible to reduce the influence of the compound P on the frequency properties by disposing the compound P in the space in the through hole 212 which is separated from the space in the through hole 211.

Meanwhile, all products other than the alkaline metal which is produced through the decomposition reaction of the metal compound P1 are gaseous bodies, and when the metal compound P1 is completely subjected to the decomposition reaction, the solid compound P does not exist in the inner space S. In this case, the products other than the alkaline metal which is produced through the decomposition reaction of the metal compound P1 exist as gaseous bodies in the inner space S, or are adsorbed or absorbed to the getter material G. Note that, in a case where the products other than the alkaline metal which is produced through the decomposition reaction of the metal compound P1 are inert gases such as nitrogen, it is possible to use the products as a portion of the buffer gas.

The getter material G has a function of adsorbing or absorbing a gas other than a desired alkaline metal gas and the buffering gas. Thus, it is possible to adsorb or absorb at least a portion of the unnecessary matter other than the alkaline metallic atoms in the inner space S to the getter material G. For this reason, it is possible to reduce an amount of the unnecessary matters floating in the atomic cell 2, and as a result, it is possible to prevent or reduce the deterioration of frequency stability, which is because that the behavior of the alkaline metallic atom is changed due to the unnecessary matter in the atomic cell 2, and the change adversely affects the EIT signal. Accordingly, it is possible to improve the frequency stability. In addition, it is possible to reduce the influence of the getter material G on the frequency properties by disposing the getter material G in the space in the through hole 212 which is separated from the space in the through hole 211.

Meanwhile, the compound P, the metal compound P1, and the getter material G will be described in detail with a manufacturing method of the atomic cell 2 described below.

The above-described atomic oscillator 1 includes the atomic cell 2 in which the getter material G is disposed in the inner space S, and thus having the excellent frequency stability.

In addition, the atomic cell 2 which is included in the above-described atomic oscillator 1 can be manufactured as follows.

Manufacturing Method of Atomic Cell

Hereinafter, the manufacturing method of the atomic cell according to the invention will be described by exemplifying a case of manufacturing the aforementioned atomic cell 2.

Note that, in the following description, the body portion 21 is formed of silicon, and an example in a case where the window portions 22 and 23 are formed of glass will be described.

Figure 5:
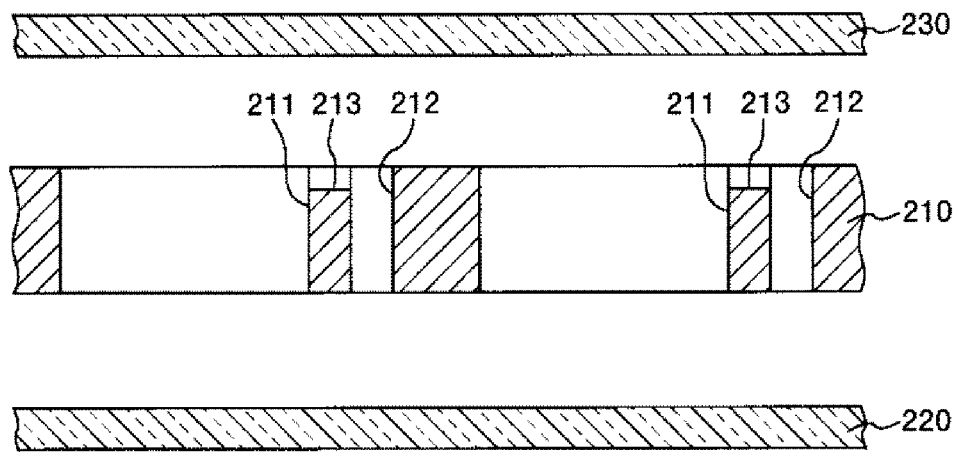
FIG. 5 is a diagram illustrating a material used in a preparing process in a manufacturing method of an atomic cell as illustrated in FIGS. 4A and 4B.
Figure 6A:
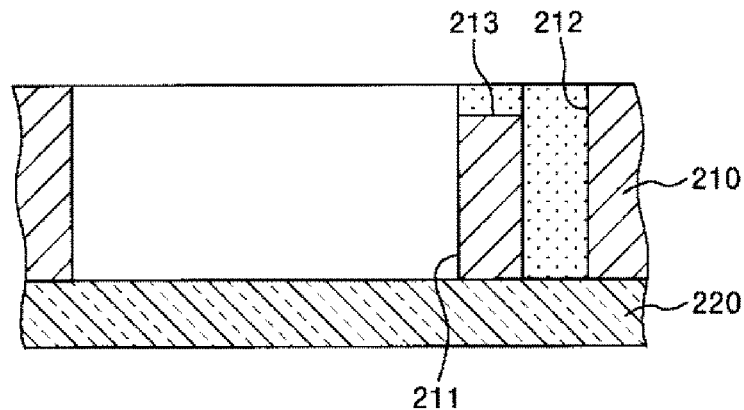
FIGS. 6A to 6C are diagrams illustrating the preparing process, a disposing process, and a sealing process in the manufacturing method of an atomic cell as illustrated in FIGS. 4A and 4B.
Figure 6B:
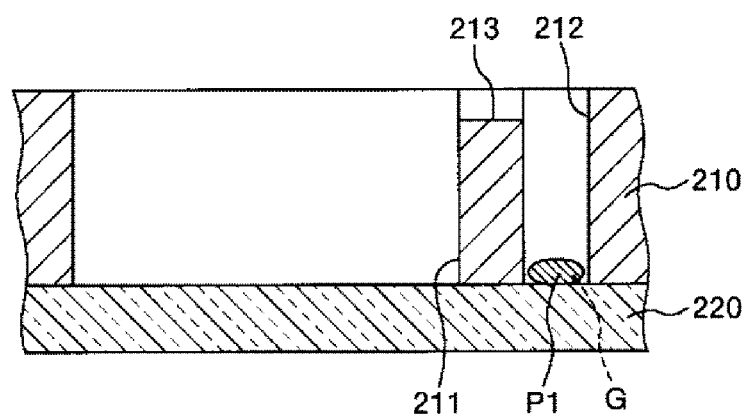
Figure 6C:
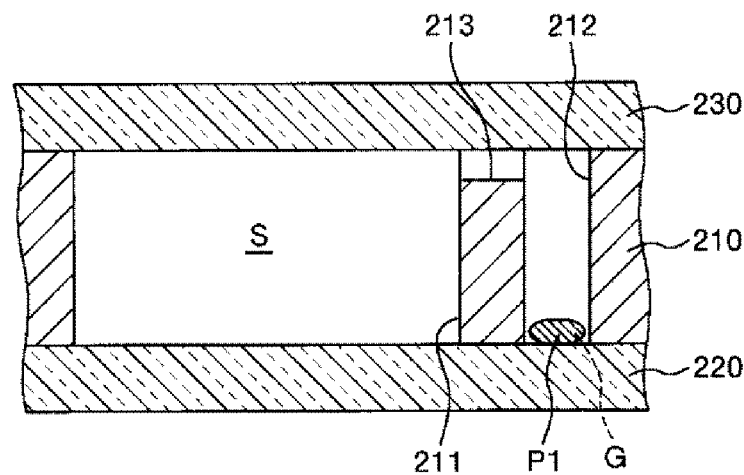
Figure 7A:
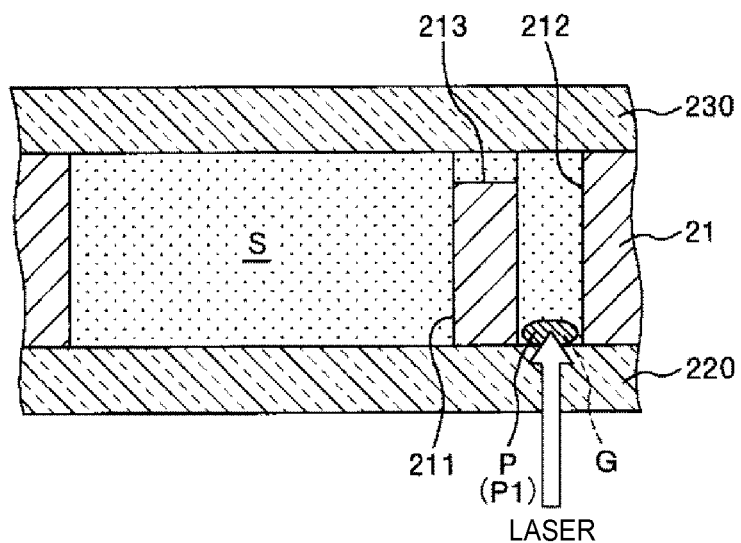
FIGS. 7A and 7B are diagrams illustrating a compound decomposing process and an individualizing process in the manufacturing method of an atomic cell as illustrated in FIGS. 4A and 4B.
Figure 7B:
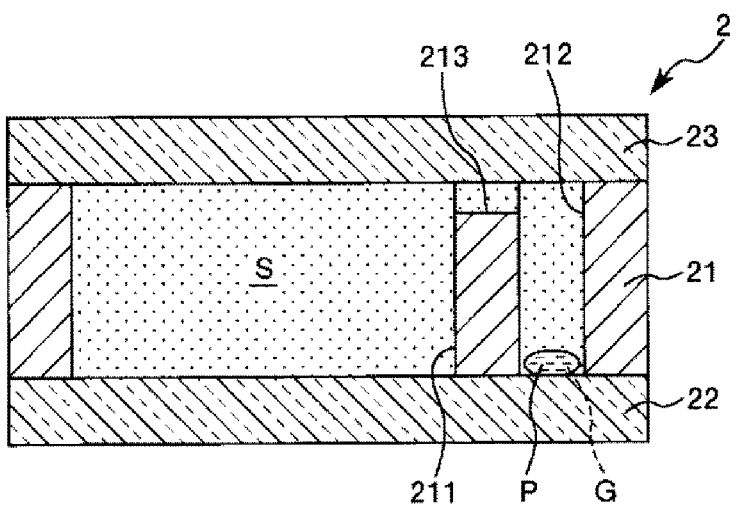

FIG. 5 is a diagram illustrating a material used in a preparing process in the manufacturing method of the atomic cell as illustrated in FIGS. 4A and 4B. FIGS. 6A to 6C are diagrams illustrating the preparing process, a disposing process, and a sealing process in the manufacturing method of the atomic cell as illustrated in FIGS. 4A and 4B. FIGS. 7A and 7B are diagrams illustrating a compound decomposing process and an individualizing process in the manufacturing method of the atomic sell as illustrated in FIGS. 4A and 4B.

The manufacturing method of the atomic cell 2 includes 1. preparing process, 2. disposing process, 3. sealing process, 4. compound decomposing process, and 5. individualizing process. Hereinafter, each process will be described in order.

1. Preparing Process

First, as illustrated in FIG. 5, a substrate for forming body portion 210 and substrates for forming window portion 220 and 230 are prepared.

The substrate for forming body portion 210 is a silicon substrate for forming the aforementioned body portion 21, and includes through holes 211 and 212, and a groove 213. In addition, the substrate for forming window portion 220 is a glass substrate for forming the aforementioned window portion 22. In the same way, the substrate for forming window portion 230 is a glass substrate for forming the aforementioned window portion 23.

In this way, since the substrate for forming body portion 210 includes silicon, each of the substrates for forming window portion 220 and 230 includes glass; it is possible to manufacture the compact atomic cell 2 having high accuracy using an etching technique and a photolithography technique.

In the embodiment, the substrate for forming body portion 210 which includes a plurality of pairs of the through holes 211 and 212, and the groove 213, will be described below. The body portion 21 is formed by being individualized in 5. individualizing process as described below. In addition, the substrates for forming window portion 220 and 230 become the window portions 22 and 23 by being individualized in 5. individualizing process as described below.

As illustrated in FIG. 6A, the substrate for forming body portion 210 and the substrate for forming window portion 220 are bonded to each other. With this, a bonded body (a stacked body) is obtained by bonding the substrate for forming body portion 210 and the substrate for forming window portion 220. This bonded body forms a "first substrate" having a concave portion formed of the through holes 211 and 212, and the groove 213 which are opened to one surface side. In addition, the substrate for forming window portion 230 forms a "second substrate".

It is preferable that the substrate for forming body portion 210 and the substrate for forming window portion 220 are bonded to each other by anodic bonding which is one kind of heat bonding. In this way, it is possible to air-tightly bond the substrate for forming body portion 210 and the substrate for forming window portion 220 in a relatively simple manner.

Note that, in this process, the substrate for forming body portion 210 and the substrate for forming window portion 230 may be bonded to each other. In this case, the bonded body obtained by bonding the substrate for forming body portion 210 and the substrate for forming window portion 230 forms the "first substrate" having a concave portion formed of the through holes 211 and 212, and the groove 213 which are opened to one surface side, and the substrate for forming window portion 220 forms the "second substrate". In this case, in 3. sealing process described later, the substrate for forming body portion 210 and the substrate for forming window portion 220 may be bonded to each other.

2. Disposing Process

Next, as illustrated in FIG. 6B, the metal compound P1 and the getter material G are disposed in the concave portion by the through hole 212. In addition, at this time, a reducing agent (not shown) required for the decomposition reaction of the metal compound P1 is disposed in the concave portion, as necessary.

The metal compound P1 is a compound containing the alkaline metal, and is a compound which generates (discharges) an alkali metal simple substance by the decomposition reaction (reduction). The metal compound P1 is not particularly limited as long as if the compound which generates the alkali metal simple substance by the decomposition reaction (reduction). Examples of the metal compound P1 include cesium chloride (CsCl), cesium azide ($CsN_3$) cesium chromate ($CsCr_2O_7$), and the like. Here, the metal compound P1 is preferably to be a compound in which the decomposition reaction is not substantially generated during the heating operation in the 3. sealing process described below, that is, a compound of which a temperature causing the decomposition reaction is higher than a heating temperature in the 3. sealing process. Therefore, it is possible to prevent or reduce the attachment of the alkaline metal on the bonded surface of the substrate for forming body portion 210 and the substrate for forming window portion 230.

In addition, the reducing agent used for the decomposition reaction of the metal compound P1 is not particularly limited, but in a case where the metal compound P1 is cesium chloride, calcium is used as the reducing agent, for example. Note that, the reducing agent may be separated from the metal compound P1, or may be integrated with the metal compound P1 as a mixture or an assembly with the metal compound P1.

Further, the getter material G has a function of adsorbing or absorbing a gas other than a desired alkaline metal gas and the buffering gas. The getter material G is not particularly limited as long as if the material has the aforementioned function. Examples of the getter material G includes an alloy containing at least one of titanium, barium, tantalum, zirconium, aluminum, vanadium, indium, and calcium, or an A-Zr—V—Fe based alloy. By using such a getter material G, it is possible to adsorb or absorb the gaseous unnecessary matter in the inner space S to the getter material G after the 3. sealing process as follows. Note that, the getter material G may be separated from the metal compound P1, or may be integrated with the metal compound P1 as a mixture or an assembly with the metal compound P1.

3. Sealing Process

Next, as illustrated in FIG. 6C, the substrate for forming body portion 210 (one surface side of the first substrate) and the substrate for forming window portion 230 are bonded to each other. With this, the concave portion which is formed of the through holes 211 and 212, and the groove 213 is sealed, thereby forming the inner space S.

As a bonding method of the substrate for forming body portion 210 and the substrate for forming window portion 230, it is possible to use the same method as the bonding method of the substrate for forming body portion 210 and the substrate for forming window portion 230 as described above. That is, in the 3. sealing process, the substrate for forming body portion 210 and the substrate for forming window portion 230 can be bonded to each other by the anodic bonding which is one kind of the heat bonding.

In the anodic bonding, the substrate for forming body portion 210 and the substrates for forming window portion 220 and 230 have a high temperature, but the alkaline metal has relatively low melting point and boiling point, for example. Therefore, at the time of heat bonding, when an alkali metal simple substance exists, the alkaline metal is attached on the bonded surface of the substrate for forming body portion 210 and the substrate for forming window portion 230, thereby causing the deterioration of the bonding strength. Accordingly, when the sealing is performed by the aforementioned bonding, the invention is applicable, thereby obtaining a remarkable effect. That is, in the invention, in the 3. sealing process, the metal compound P1 which is disposed in the concave portion formed of the through holes 211 and 212, and the groove 213 is maintained to be in a solid state even at the time of the anodic bonding, and thus it is possible to prevent or reduce the attachment of the alkaline metal on the bonded surface of the substrate for forming body portion 210 and the substrate for forming window portion 230.

4. Compound Decomposing Process

Next, as illustrated in FIG. 7A, the metal compound P1 is irradiated with laser (the energy line). With this, the metal compound P1 is subjected to the decomposition reaction, thereby extracting the alkali metal simple substance.

At this time, with the decomposition reaction of the metal compound P1, a reaction product other than the alkaline metal is generated, and the unreacted metal compound P1 becomes a residual compound P as the residual.

Specifically, for example, in a case where the metal compound P1 is cesium chloride, and calcium is used as the reducing agent, in the process, reaction expressed by $2CsCl+Ca \rightarrow 2Cs\uparrow + CaCl_2$ is generated. In this way, it is possible to extract cesium as the simple substance by reducing cesium chloride with calcium as the reducing agent. For this reason, it is possible to seal the cesium atom in the atomic cell 2.

Further, when the metal compound P1 is cesium azide, in the process, reaction expressed by $2CsN_3 \rightarrow 2Cs+3N_2$ is generated. In this way, it is possible to extract cesium as the simple substance by reducing cesium azide. For this reason, it is possible to seal the cesium atom in the atomic cell 2.

In the process, when the metal compound P1 is irradiated with the energy line, the decomposition reaction is generated, and thus it is possible that the metal compound P1 which is disposed in the sealed inner space S is subjected to the decomposition reaction. Note that, FIG. 7A illustrates an example that the decomposition reaction of the metal compound P1 is generated by using the laser, but the irradiating means is not limited to the laser as long as the decomposition reaction of the metal compound P1 can be generated. For example, light other than the laser, electromagnetic waves such as an X line, or a γ line, an electron beam, a particle beam such as an ion beam, or a combination of two or more of these energy lines can be used. In addition, the decomposition reaction may be generated by heating the metal compound P1 by electromagnetic induction.

5. Individualizing Process

Next, the substrate for forming body portion 210 and the stacked structure (the bonded body) which is formed of the substrates for forming window portion 220 and 230 is individualized by, for example, dicing. With this, the atomic cell 2 can be obtained as illustrated in FIG. 7B.

In the embodiment, as described above, in the 1. preparing process, the first substrate includes a plurality of concave portions formed of the through holes 211 and 212, and the groove 213, and in 5. individualizing process after the 3. sealing process, the bonded body obtained by bonding the first substrate and the second substrate, that is, the bonded body obtained by bonding the substrate for forming body portion 210 and the substrates for forming window portion 220 and 230 is individualized for each concave portion formed of the through holes 211 and 212, and the groove 213. With this processes, it is possible to efficiently manufacture the atomic cell.

According to the manufacturing method of the atomic cell 2 as described above, it is possible to obtain the atomic cell 2 which exhibits the above described effect.

In addition, the alkaline metallic atoms are sealed in the inner space S by using the solid metal compound P1, and thus in the 3. sealing process, it is possible to prevent alkaline metallic atoms from attaching on the bonded surface of the substrate for forming body portion 210 and the substrate for forming window portion 230. Therefore, it is possible to simply and firmly bond the substrate for forming body portion 210 and the substrate for forming window portion 230. As a result, it is possible to improve reliability of the atomic cell 2.

Second Embodiment

Next, the second embodiment of the invention will be described.

Figure 8A:
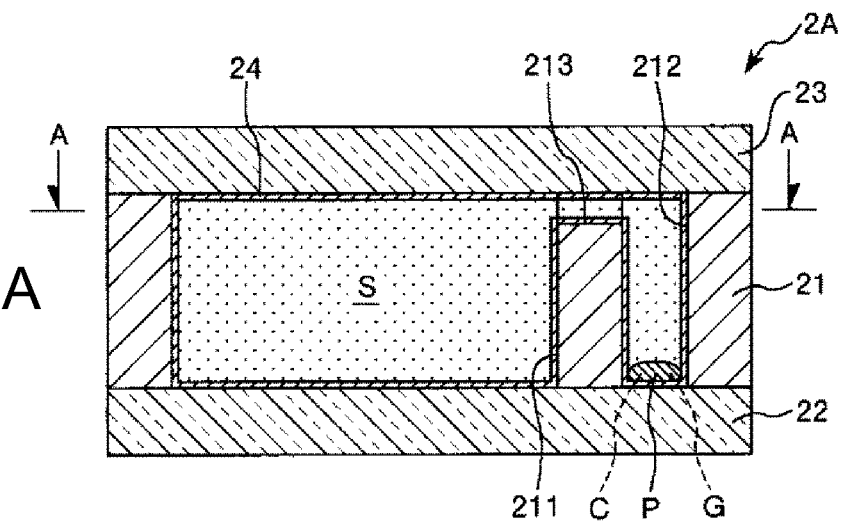
FIG. 8A is a longitudinal view of an atomic cell which is included in the atomic oscillator according to a second embodiment.
Figure 8B:
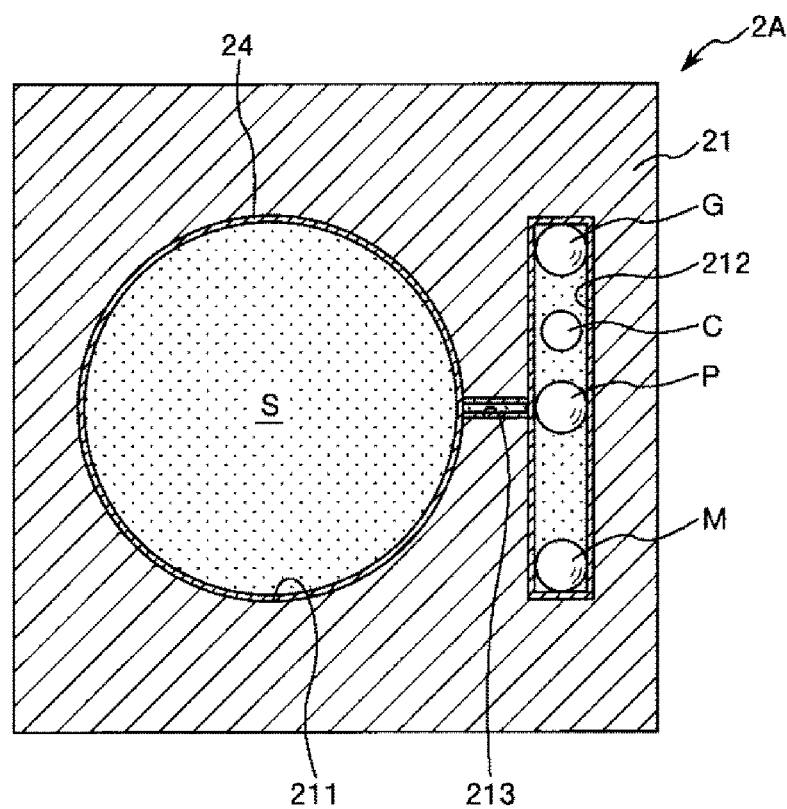
FIG. 8B is a sectional view (cross-sectional view) taken along line A-A in FIG. 8A.

FIG. 8A is a longitudinal view of the atomic cell which is included in the atomic oscillator according to a second embodiment of the invention, and FIG. 8B is a sectional view (cross-sectional view) taken along line A-A in FIG. 8A.

The present embodiment has the same configuration as in the first embodiment except that a coating film is provided on the inner wall surface of the atomic cell.

Note that, in the following description, the description of the second embodiment will focus on the differences from the embodiments described above and the same matters will be omitted.

In the atomic cell 2A (a gas cell) as illustrated in FIGS. 8A and 8B, a coating film 24 is disposed on the wall surface of the inner space S. Therefore, the behavior of the gaseous alkaline metallic atoms in the atomic cell 2A is stabilized, and as a result, it is possible to improve the frequency stability. More specifically, the coating film 24 has a function of suppressing or reducing a change of the behavior of the gaseous alkali metal when colliding with the inner wall surface of the inner space S (for example, a spin). With this, even in a case where the atomic cell 2A is miniaturized, it is possible to suppress the adverse influence of the change of the behavior when the alkaline metal collides with the inner wall surface of the atomic cell 2A on the properties, and thereby it is possible to make oscillation properties of the atomic oscillator 1 excellent.

A forming material of the coating film. 24 preferably contains a fluorine-based resin, a siloxane-based compound, or a saturated hydrocarbon chain. With this, it is possible to efficiently reduce the change of the behavior when the alkaline metal collides with the coating film 24, and the aforementioned material is excellent in chemical stability. In addition, it is possible to increase the boiling point of the coating material to be higher than the boiling point of the metallic atoms.

In addition, a coating material used to form the coating film 24, that is, the component or a precursor of the coating film 24 will be more specifically described in the following description of the manufacturing method of the atomic cell 2A.

In addition, in the embodiment, the getter material G and the compound P are held in the coating film 24. Therefore, the movement of the getter material or the like is prevented or reduced, and thus it is possible to prevent or reduce the influence of the getter material G on the EIT signal.

In FIGS. 8A and 8B, a surplus coating agent C is disposed in the space in the through hole 212. This coating agent C is a surplus of the coating agent used to form the coating film 24 at the time of manufacturing the atomic cell 2A, and does not exist when using the coating agent having the amount which does not exceed at the time of manufacturing the atomic cell 2A.

It is possible to manufacture the above-described atomic cell 2A as follows.

Figure 9A:
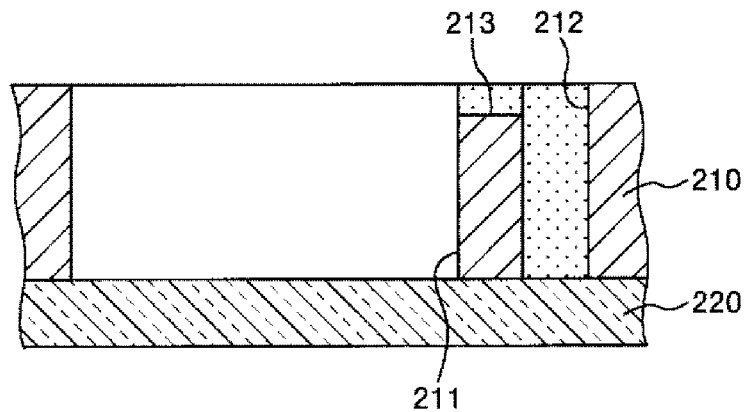
FIGS. 9A to 9C are diagrams illustrating a preparing process, a disposing process, and a sealing process in the manufacturing method as illustrated in FIG. 8.
Figure 9B:
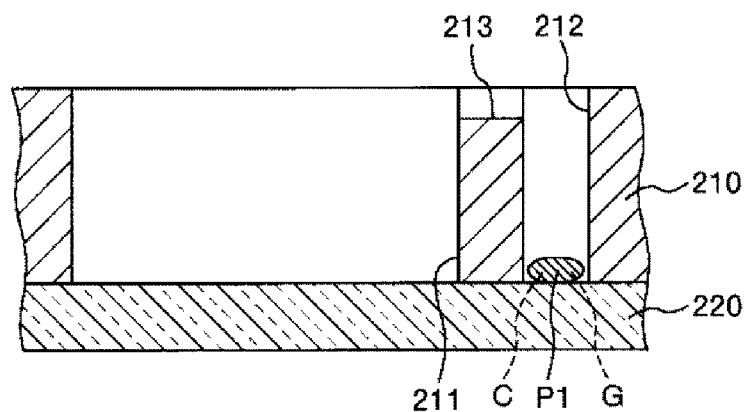
Figure 9C:
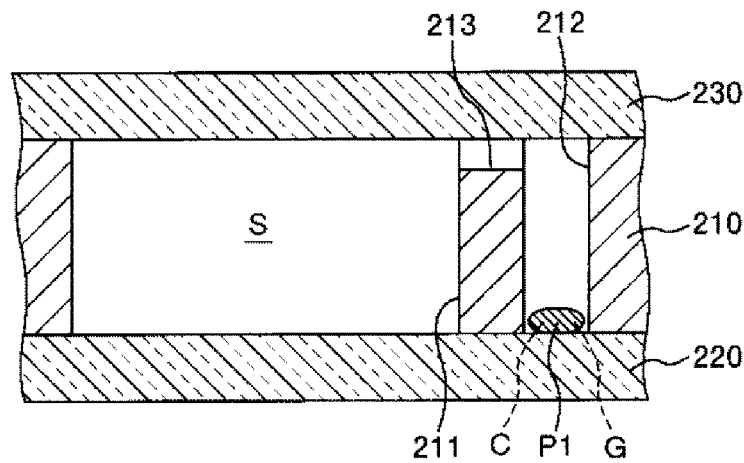
Figure 10A:
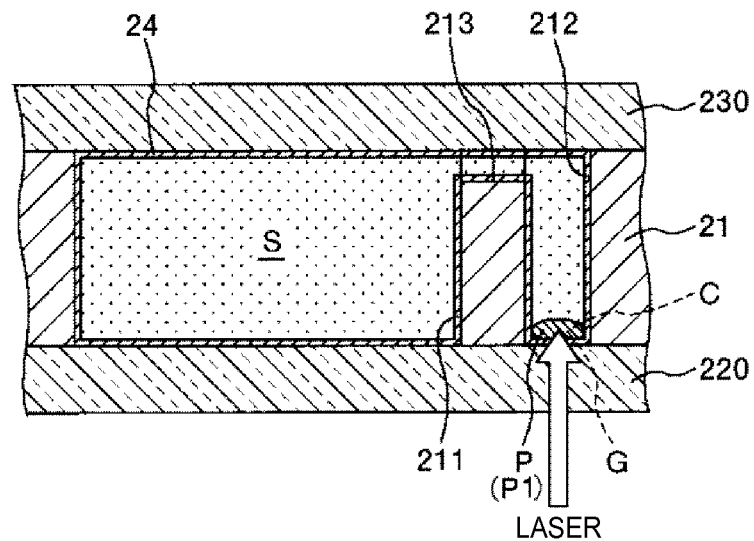
FIGS. 10A and 10B are diagrams illustrating a compound decomposing process and an individualizing process in the manufacturing method of an atomic cell as illustrated in FIG. 8.
Figure 10B:
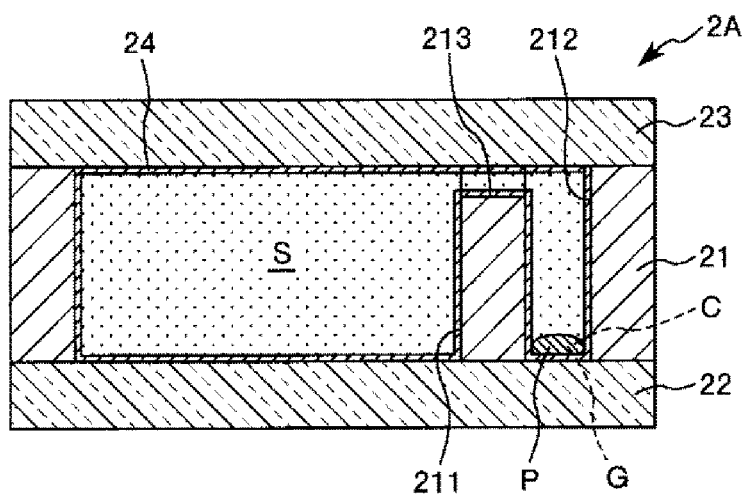

FIGS. 9A to 9C are diagrams illustrating the preparing process, a disposing process, and a sealing process in the manufacturing method as illustrated in FIGS. 8A and 8B. FIGS. 10A and 10B are diagrams illustrating a compound decomposing process and an individualizing process in the manufacturing method as illustrated in FIGS. 8A and 8B.

The manufacturing method of the atomic cell 2A includes 1A preparing process, 2A. disposing process, 3A. sealing process, 4A. compound decomposing process, and 5A. individualizing process. Hereinafter, each process will be described in order.

1A. Preparing Process

First, as in the first embodiment, the substrate for forming body portion 210 and the substrates for forming window portion 220 and 230 are prepared, and as illustrated in FIG. 9A, the substrate for forming body portion 210 and the substrate for forming window portion 220 are bonded to each other.

2A. Disposing Process

Next, as illustrated in FIG. 9B, the metal compound P1, the getter material G, and the coating agent C are disposed in the concave portion formed of the through hole 212.

The example of the coating agent C is not limited as long as it is possible to form the coating film 24 having the aforementioned function, but the coating agent C is preferably a compound of any one of a fluorine-based resin, a siloxane-based compound, and a saturated hydrocarbon chain or the precursor thereof.

Examples of the fluorine-based resin used as the coating agent C include polytetrafluoroethylene (PTFE), polychlorotrifluoroethylene (PCTFE), polyvinylidene fluoride (PVDF), polyvinyl fluoride (PVF), a perfluoroalkoxy fluorine resin (PFA), tetrafluoroethylene/hexafluoropropylene copolymers (FEP), an ethylene tetrafluoroethylene copolymer (ETFE), and an ethylene chlorotrifluoroethylene copolymer (ECTFE) and the like.

In addition, examples of the siloxane-based compound used as the coating agent C include alkoxysilane such as methyltrimethoxysilane, dimethyldimethoxysilane, phenyltrimethoxysilane, methyltriethoxysilane, dimethyl diethoxy silane, phenyl triethoxy silane, hexyl trimethoxy silane, hexyl triethoxy silane, decyl trimethoxy silane, and trifluoropropyl trimethoxy silane, silazane such as hexamethyldisilazane, siloxane such as hydrolyzable group-containing siloxane, and the like.

In addition, examples of the saturated hydrocarbon chain used as the coating agent C include paraffin (alkane of which the number of carbon atoms is equal to or more than 20) and the like.

3A. Sealing Process

Next, as in the first embodiment, as illustrated in FIG. 9C, the substrate for forming body portion 210 (one surface side of the first substrate) and the substrate for forming window portion 230 are bonded to each other. With this, the concave portion which is formed of the through holes 211 and 212, and the groove 213 is sealed, and thereby the inner space S is formed.

4A. Compound Decomposing Process

Next, as illustrated in FIG. 10A, as in the first embodiment, the metal compound P1 is irradiated with the laser (the energy line). With this, the metal compound P1 is subjected to the decomposition reaction, thereby producing the alkali metal. At this time, the coating agent C is made to be gaseous by heating the coating agent C by the laser, and then the gaseous coating agent is attached and solidified on the wall surface of the inner space S, thereby forming the coating film 24 in a state of holding the compound P.

Here, the coating agent C may be irradiated with the laser at the same time when the metal compound P1 is irradiated with the laser, or before and after the metal compound P1 is irradiated with the laser.

5A. Individualization Process

Next, as in the first embodiment, the stacked structure (the bonded body) which is formed of the substrate for forming body portion 210 and the substrates for forming window portion 220 and 230 is individualized. Thus, as illustrated in FIG. 10B, the atomic cell 2A is obtained.

2. Electronic Device

The above-described atomic oscillator may be applied to various electronic devices.

Hereinafter, an electronic device according to an embodiment of the invention will be described.

Figure 11:
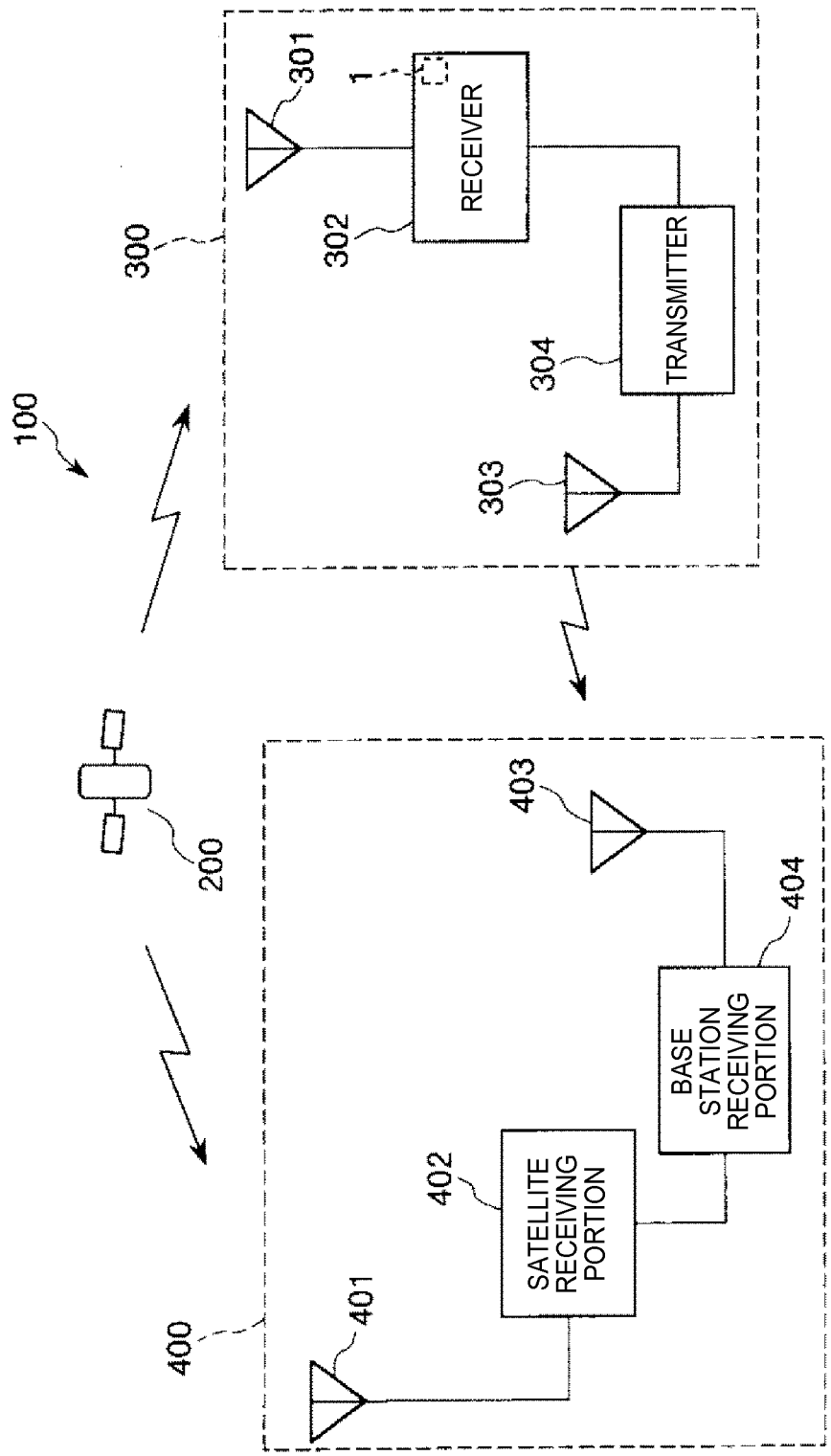
FIG. 11 is a diagram illustrating a schematic configuration when an atomic oscillator according to the invention is used in a positioning system using a GPS satellite.

FIG. 11 is a diagram illustrating a schematic configuration in which the atomic oscillator according to the invention is used in a positioning system using a GPS satellite.

A positioning system 100 as illustrated in FIG. 11 includes a GPS satellite 200, a base station 300, and a GPS receiver 400.

The GPS satellite 200 transmits positioning information (a GPS signal).

The base station 300 includes a receiver 302 that receives positioning information from the GPS satellite 200 through an antenna 301, for example, provided at an electronic reference point (a GPS continuous observation station) with high accuracy, and a transmitter 304 that transmits the positioning information received by the receiver 302 through an antenna 303.

Here, the receiver 302 is an electronic device that includes the atomic oscillator 1 according to the invention as a reference frequency oscillation source. The receiver 302 having such a configuration has excellent reliability. Further, the positioning information received by the receiver 302 is transmitted by the transmitter 304 in real time.

The GPS receiver 400 includes a satellite receiving portion 402 that receives positioning information from the GPS satellite 200 through an antenna 401, and a base station receiving portion 404 that receives positioning information from the base station 300 through an antenna 403.

3. Moving Object

Figure 12:
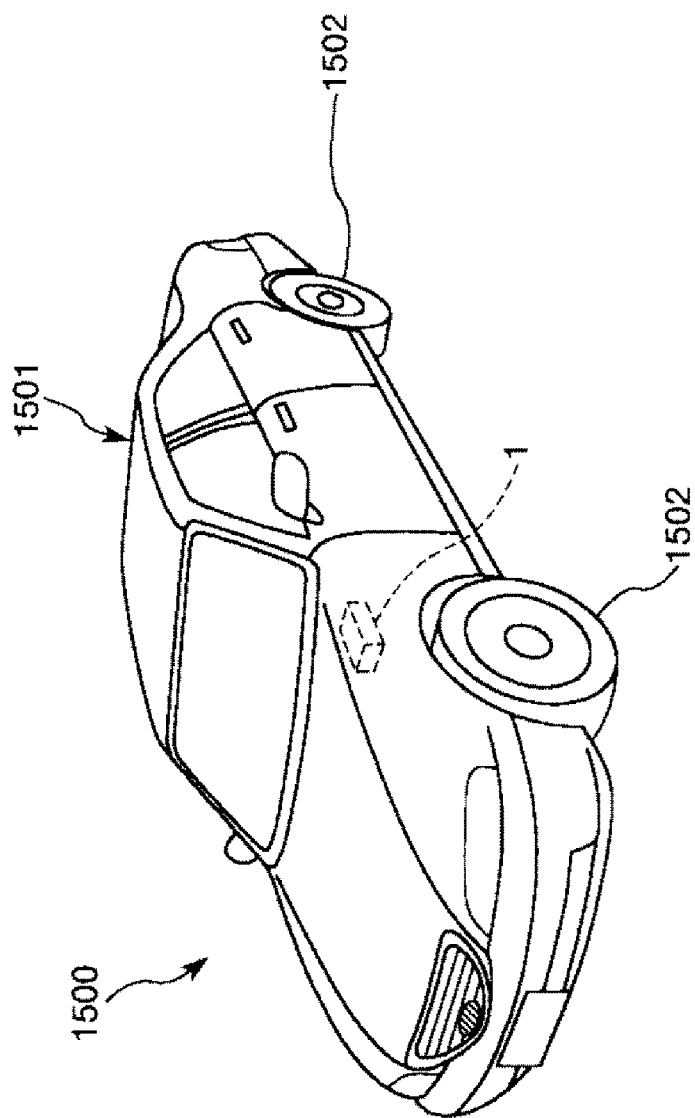
FIG. 12 is a diagram illustrating a moving object according to the invention.

FIG. 12 is a diagram illustrating an example of a moving object according to an embodiment of the invention.

In FIG. 12, a moving object 1500 includes a vehicle body 1501, and four wheels 1502, in which the wheels 1502 are rotated by an engine (not shown) provided in the vehicle body 1501. The atomic oscillator 1 is built into the moving object 1500.

The electronic device according to the invention is not limited to the above description. For example, the electronic device may be applied to a mobile phone, a digital still camera, an inkjet type discharging apparatus (for example, an inkjet printer), a personal computer (a mobile type personal computer or a laptop type personal computer), a television, a video camera, a video tape recorder, a car navigator, a pager, an electronic organizer (including a communication function), an electronic dictionary, an electronic calculator, an electronic game player, a word processor, a work station, a video phone, a TV monitor for crime prevention, electronic binoculars, a POS terminal, a medical device (for example, an electronic thermometer, a blood pressure manometer, a blood glucose monitoring system, an electrocardiographic apparatus, ultrasonic diagnostic equipment, or an electronic endoscopy), a fish-finder, various measuring apparatuses, meters (for example, meters of a vehicle, an airplane, or a ship), a flight simulator, a terrestrial digital broadcasting system, a mobile phone base station, a GPS module, or the like.

Hereinbefore, embodiments of the atomic cell, the atomic cell manufacturing method, the quantum interference device, the atomic oscillator, the electronic device, and the moving object according to the invention have been described with reference to the accompanying drawings, but the invention is not limited thereto.

In addition, the invention may have a configuration in which an arbitrary component having the same function as in the above-described embodiment is substitutively provided, and a configuration in which an arbitrary component is added thereto.

Further, the invention may have a configuration in which arbitrary components of the above-described embodiments are combined.

Further, in the description of the embodiments above, the atomic cell according to the invention is used to the quantum interference device which transitions cesium and the like in a resonant manner by using the coherent population trapping using two types of lights having different wavelengths, however, the atomic cell according to the invention is not limited thereto, but is applicable to a double resonance device which transitions rubidium and the like in a resonant manner by using a double resonance phenomenon due to light and microwaves.

What is claimed is:

1. An atomic cell comprising:
   first and second windows that are opposite to each other;
   walls that are provided between the first and second windows so as to create a main inner space having a first top and a first bottom, a secondary inner space having a second to and a second bottom, and an air communication channel, the main inner space being directly adjacent to centers of the first and second windows, the main inner space being larger than the secondary inner space, the air communication channel being provide between the first top and the second top so that the main inner space and the secondary inner space are connected via the air communication channel;
   metallic atoms that are disposed on the second bottom of the secondary inner space; and
   a getter material that is disposed on the second bottom of the secondary inner space.

2. The atomic cell according to claim 1,
   wherein a coating film is provided on surfaces of the walls facing the main inner space and the secondary inner space.

3. The atomic cell according to claim 2,
wherein the getter material is held in the coating film.

4. An atomic cell manufacturing method comprising:
preparing first and second windows;
preparing a body substrate having walls;
bonding the first window to one side of the body substrate so that a top surface of the first window and the walls form a main recess and a secondary recess, the main recess having a first bottom, the secondary recess having a second bottom;
disposing a metal compound including metal and a getter material on the second bottom of the secondary recess;
sealing the main recess and the secondary recess by bonding the second window to the other side of the body substrate so as to make an air communication channel along a bottom surface of the second window, the main recess and the bottom surface of the second window forming a main inner space, the secondary recess and the bottom surface of the second window forming a secondary inner space, the main inner space and the secondary inner space being connected via the air communication channel; and
subjecting the metal compound to a decomposition reaction so as to extract the metal.

5. The atomic cell manufacturing method according to claim 4,
wherein the metal compound is cesium chloride, and
wherein in the disposing of the metal compound, calcium is disposed in the main inner space.

6. The atomic cell manufacturing method according to claim 4,
wherein the metal compound is cesium azide.

7. The atomic cell manufacturing method according to claim 4,
wherein in the subjecting of the metal compound to the decomposition reaction, the metal compound is irradiated with an energy line so as to be subjected to the decomposition reaction.

8. The atomic cell manufacturing method according to claim 4,
wherein the getter material is an alloy including at least one of titanium, barium, tantalum, zirconium, aluminum, vanadium, indium, and calcium, or an Al—Zr—V—Fe based alloy.

9. The atomic cell manufacturing method according to claim 4,
wherein the first window includes silicon, and
wherein the second window includes glass.

10. The atomic cell manufacturing method according to claim 9,
wherein the first and second windows are bonded to the body substrate by heat bonding.

11. The atomic cell manufacturing method according to claim 10,
wherein the first and second windows are bonded to the body substrate by anodic bonding.

12. The atomic cell manufacturing method according to claim 4,
wherein there are a plurality of the main recesses and a plurality of the secondary recesses that are formed by the body substrate and the first window.

13. The atomic cell manufacturing method according to claim 12, further comprising:
individualizing a bonded body obtained by bonding the first and second windows to the body substrate for each pair of the main inner space and the secondary inner space, after the sealing of the main recess and the secondary recess.

14. A quantum interference device comprising the atomic cell according to claim 1.

15. A quantum interference device comprising the atomic cell according to claim 2.

16. An atomic oscillator comprising the atomic cell according to claim 1.

17. An atomic oscillator comprising the atomic cell according to claim 2.

18. An electronic device comprising the atomic cell according to claim 1.

19. A moving object comprising the atomic cell according to claim 1.

* * * * *